United States Patent
Fung et al.

(10) Patent No.: US 11,658,042 B2
(45) Date of Patent: May 23, 2023

(54) METHODS FOR ETCHING STRUCTURES AND SMOOTHING SIDEWALLS

(71) Applicant: Applied Materials, Inc., Santa Clara, CA (US)

(72) Inventors: Nancy Fung, Livermore, CA (US); Gabriela Alva, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 17/369,812

(22) Filed: Jul. 7, 2021

(65) Prior Publication Data

US 2022/0059365 A1   Feb. 24, 2022

Related U.S. Application Data

(60) Provisional application No. 63/067,117, filed on Aug. 18, 2020.

(51) Int. Cl.
| | |
|---|---|
| H01L 21/3213 | (2006.01) |
| C23F 1/12 | (2006.01) |
| H01L 21/311 | (2006.01) |
| H01L 21/306 | (2006.01) |
| H01L 21/3065 | (2006.01) |

(52) U.S. Cl.
CPC .......... *H01L 21/32135* (2013.01); *C23F 1/12* (2013.01); *H01L 21/3065* (2013.01); *H01L 21/30625* (2013.01); *H01L 21/31116* (2013.01); *H01L 21/32136* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 4,713,141 A | 12/1987 | Tsang | |
| 5,354,417 A | 10/1994 | Cheung et al. | |
| 2003/0186074 A1 | 10/2003 | Chen et al. | |
| 2015/0099368 A1 | 4/2015 | Shen et al. | |
| 2016/0005621 A1* | 1/2016 | Toda | H01L 21/67109 156/345.24 |
| 2017/0278864 A1 | 9/2017 | Hu et al. | |
| 2020/0350014 A1 | 11/2020 | Liu | |
| 2021/0249436 A1 | 8/2021 | Ding et al. | |

FOREIGN PATENT DOCUMENTS

| | | |
|---|---|---|
| JP | 5578389 B2 | 8/2014 |
| KR | 100170412 | 3/1999 |

OTHER PUBLICATIONS

International Search Report dated Oct. 29, 2021 for Application No. PCT/US2021/040742.

* cited by examiner

*Primary Examiner* — Jiong-Ping Lu
(74) *Attorney, Agent, or Firm* — Patterson + Sheridan, LLP

(57) ABSTRACT

A method for patterning a material layer on a substrate includes forming a hard mask layer on a material layer disposed on a substrate, the material layer comprising a plurality of first layers and a plurality of second layers alternately formed over the substrate, performing a first etch process to form features in the material layer through the hard mask layer by supplying a first etching gas, and performing a second etch process to smooth sidewalls of the features formed in the material layer by suppling a second etching gas. The first etching gas is supplied continuously and the second etching gas is pulsed.

19 Claims, 5 Drawing Sheets

METHODS FOR ETCHING STRUCTURES AND SMOOTHING SIDEWALLS

CROSS-REFERENCE TO RELATED APPLICATIONS

This application claims priority to U.S. Provisional Patent Application Ser. No. 63/067,117, filed on Aug. 18, 2020, which is incorporated by reference herein.

BACKGROUND

Field

Embodiments of the present disclosure generally relate to etching processes of structures in semiconductor applications. Particularly, embodiments of the present disclosure provide methods for etching stacked material layers to form features therein having smooth sidewalls.

Description of the Related Art

In smaller and lighter electronic devices with higher performance and increased features, three dimensional (3D) integrated circuits (ICs) designed with through-vias and trenches have been adapted. Through-vias and trenches are used for electrical connections which pass through stacked material layers formed on a semiconductor wafer. The adoption of through-vias and trenches has faced high costs and challenges associated with high volume manufacturing. One such challenge includes creating through-vias and trenches with smooth sidewalls. Through-vias and trenches with smooth sidewalls are generally more robust and can be effectively filled with materials such as dielectrics and metals. In contrast, through-vias and trenches with rough sidewalls (e.g., scalloped sidewalls) can result in ineffective filling, leading to reduced yield and long-term device reliability problems. Unfortunately, existing etching methods create through-vias and trenches with rough sidewalls, and/or are impractical for high volume manufacturing. Another factor influencing adoption of through-vias and trenches includes the cost of performing plasma etching, which is influenced by, for example, the overall etch rate.

Therefore, there is a need for a method for performing an etching process for forming features having smooth sidewalls in material layers with a fast etch rate.

SUMMARY

Embodiments of the present disclosure provide a method for patterning a material layer on a substrate. The method includes forming a hard mask layer on a material layer disposed on a substrate, the material layer comprising a plurality of first layers and a plurality of second layers alternately formed over the substrate, performing a first etch process to form features in the material layer through the hard mask layer by supplying a first etching gas, and performing a second etch process to smooth sidewalls of the features formed in the material layer by suppling a second etching gas. The first etching gas is supplied continuously and the second etching gas is pulsed.

Embodiments of the present disclosure also provide a method for etching a material layer on a substrate through a hard mask in a processing chamber. The method includes supplying a first etching gas to a material layer having a hard mask formed thereon in a processing chamber, the material layer comprising a plurality of first layers and a plurality of second layers alternately formed over a substrate, and subsequent to supplying the first etching gas, supplying a second etching gas into features etched in the material layer by the first etching gas. The first etching gas is supplied continuously and the second etching gas is pulsed.

Embodiments of the present disclosure also provide a method for smoothing sidewalls of features etched in a material layer. The method includes pulsing fluorine containing etching gas to a material layer in a processing chamber, the material layer comprising a plurality of first layers and a plurality of second layers alternately formed over a substrate, and continuously supplying passivation gas and inert gas in the processing chamber.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features with desired small dimensions in a stacked metal layer are provided. The methods utilize a two-step etching process, which includes a main etch process to form features through the stacked metal layer at a fast etch rate and a post etch process to smooth sidewalls of the features. By doing so, features having smooth sidewalls can be formed at a high overall etch rate.

Figure 1:
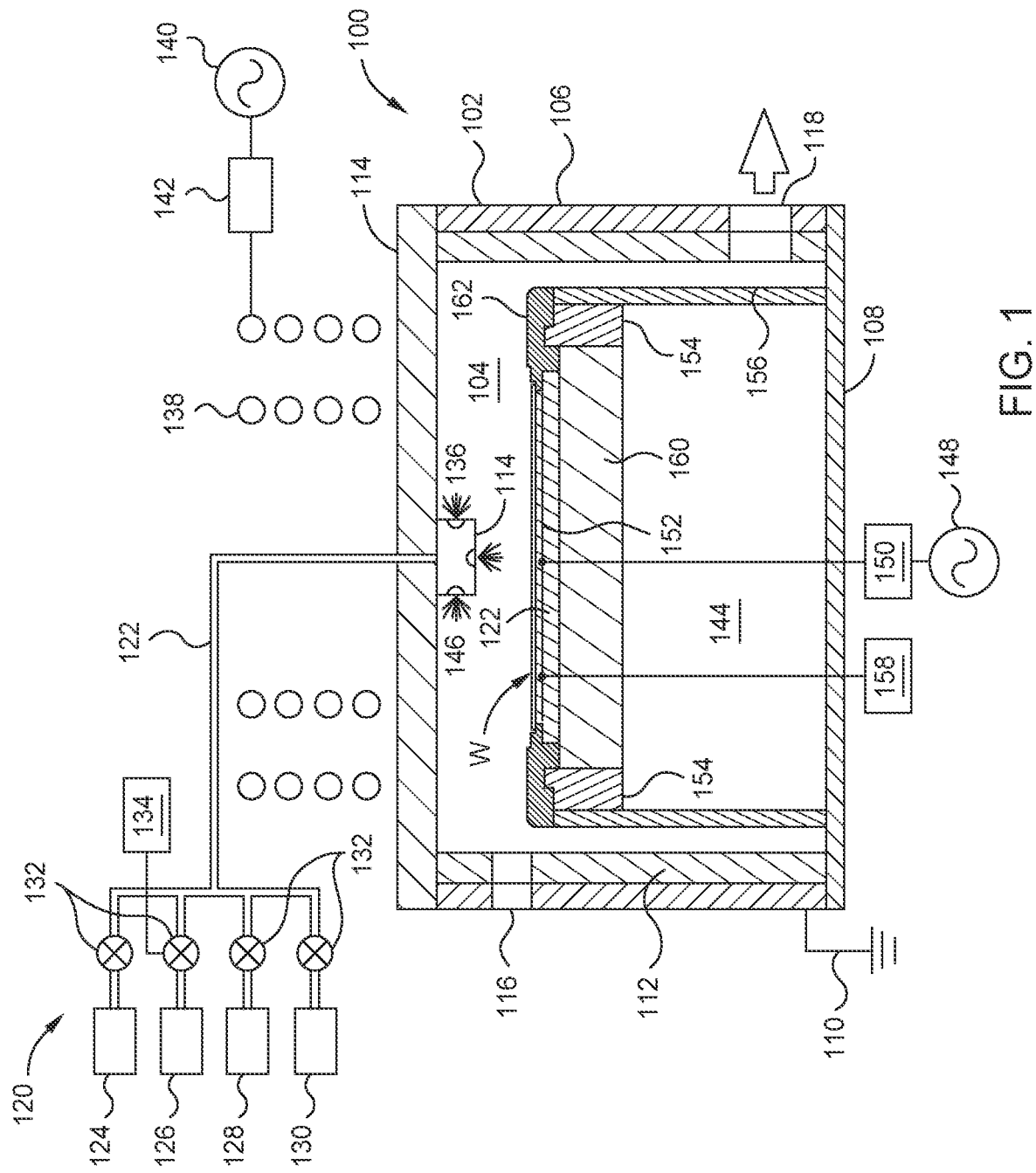
FIG. 1 is a schematic cross-sectional view of a processing chamber configured to perform a patterning process according to one or more embodiments of the disclosure.

FIG. 1 is a schematic cross-sectional view of an exemplary plasma processing chamber 100 suitable for performing a patterning process. One example of the plasma processing chamber 100 that may be adapted to benefit from the disclosure is an CENTRIS® Sym3™ etching processing chamber, available from Applied Materials, Inc., located in Santa Clara, Calif. It is contemplated that other process chambers, including those from other manufactures, may be adapted to practice embodiments of the disclosure.

The plasma processing chamber 100 includes a chamber body 102 having a chamber volume 104 defined therein. The chamber body 102 has sidewalls 106 and a bottom 108 which are coupled to ground 110. The sidewalls 106 have a liner 112 to protect the sidewalls 106 and extend the time between maintenance cycles of the plasma processing chamber 100. The dimensions of the chamber body 102 and related components of the plasma processing chamber 100 are not limited and generally are proportionally larger than the size of the substrate W to be processed therein. Examples of substrate sizes include 200 mm diameter, 250 mm diameter, 300 mm diameter and 450 mm diameter, among others.

The chamber body 102 supports a chamber lid assembly 114 to enclose the chamber volume 104. The chamber body 102 may be fabricated from aluminum or other suitable materials. A substrate access port 116 is formed through the sidewall 106 of the chamber body 102, facilitating the transfer of the substrate W into and out of the plasma processing chamber 100. The substrate access port 116 may be coupled to a transfer chamber and/or other chambers of a substrate processing system (not shown).

A pumping port 118 is formed through the sidewall 106 of the chamber body 102 and connected to the chamber volume 104. A pumping device (not shown) is coupled through the pumping port 118 to the chamber volume 104 to evacuate and control the pressure therein. The pumping device may include one or more pumps and throttle valves.

A gas panel 120 is coupled by a gas line 122 to the chamber body 102 to supply process gases into the chamber volume 104. The gas panel 120 may include one or more process gas sources 124, 126, 128, 130 and may additionally include inert gases, non-reactive gases, and reactive gases, if desired. Examples of process gases that may be provided by the gas panel 120 include, but are not limited to, hydrocarbon containing gas including methane ($CH_4$), sulfur hexafluoride ($SF_6$), silicon chloride ($SiCl_4$), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gases may include nitrogen, chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$ and $H_2$ among others.

Valves 132 control the flow of the process gases from the process gas sources 124, 126, 128, 130 from the gas panel 120 and are managed by a controller 134. The flow of the gases supplied to the chamber body 102 from the gas panel 120 may include combinations of the gases.

The chamber lid assembly 114 may include a nozzle 136. The nozzle 136 has one or more ports for introducing the process gases from the process gas sources 124, 126, 128, 130 of the gas panel 120 into the chamber volume 104. After the process gases are introduced into the plasma processing chamber 100, the gases are energized to form plasma. An antenna 138, such as one or more inductor coils, may be provided adjacent to the plasma processing chamber 100. An antenna power supply 140 may power the antenna 138 through a match circuit 142 to inductively couple energy, such as RF energy, to the process gas to maintain a plasma formed from the process gas in the chamber volume 104 of the plasma processing chamber 100. Alternatively, or in addition to the antenna power supply 140, process electrodes below the substrate W and/or above the substrate W may be used to capacitively couple RF power to the process gases to maintain the plasma within the chamber volume 104. The operation of the antenna power supply 140 may be controlled by a controller, such as controller 134, that also controls the operation of other components in the plasma processing chamber 100.

A substrate support pedestal 144 is disposed in the chamber volume 104 to support the substrate W during processing. The substrate support pedestal 144 may include an electrostatic chuck (ESC) 146 for holding the substrate W during processing. The ESC 146 uses the electrostatic attraction to hold the substrate W to the substrate support pedestal 144. The ESC 146 is powered by an RF power supply 148 integrated with a match circuit 150. The ESC 146 comprises an electrode 152 embedded within a dielectric body. The electrode 152 is coupled to the RF power supply 148 and provides a bias which attracts plasma ions, formed by the process gases in the chamber volume 104, to the ESC 146 and substrate W positioned thereon. The RF power supply 148 may cycle on and off, or pulse, during processing of the substrate W. The ESC 146 has an isolator 154 for the purpose of making the sidewall of the ESC 146 less attractive to the plasma to prolong the maintenance life cycle of the ESC 146. Additionally, the substrate support pedestal 144 may have a cathode liner 156 to protect the sidewalls of the substrate support pedestal 144 from the plasma gases and to extend the time between maintenance of the plasma processing chamber 100.

Furthermore, the electrode 152 is coupled to a power source 158. The power source 158 provides a chucking voltage of about 200 volts to about 2000 volts to the electrode 152. The power source 158 may also include a system controller for controlling the operation of the electrode 152 by directing a DC current to the electrode 152 for chucking and de-chucking the substrate W.

The ESC 146 may include heaters disposed therein and connected to a power source (not shown), for heating the substrate, while a cooling base 160 supporting the ESC 146 may include conduits for circulating a heat transfer fluid to maintain a temperature of the ESC 146 and substrate W disposed thereon. The ESC 146 is configured to perform in the temperature range required by the thermal budget of the device being fabricated on the substrate W. For example, the ESC 146 may be configured to maintain the substrate W at a temperature of about 25 degrees Celsius to about 500 degrees Celsius for certain embodiments.

The cooling base 160 is provided to assist in controlling the temperature of the substrate W. To mitigate process drift and time, the temperature of the substrate W may be maintained substantially constant by the cooling base 160 throughout the time the substrate W is in the cleaning chamber. In one embodiment, the temperature of the substrate W is maintained throughout subsequent cleaning processes at about 30 to 120 degrees Celsius.

A cover ring 162 is disposed on the ESC 146 and along the periphery of the substrate support pedestal 144. The cover ring 162 is configured to confine etching gases to a desired portion of the exposed top surface of the substrate W, while shielding the top surface of the substrate support pedestal 144 from the plasma environment inside the plasma processing chamber 100. Lift pins (not shown) are selectively moved through the substrate support pedestal 144 to lift the substrate W above the substrate support pedestal 144 to facilitate access to the substrate W by a transfer robot (not shown) or other suitable transfer mechanism.

The controller 134 may be utilized to control the process sequence, regulating the gas flows from the gas panel 120 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2:
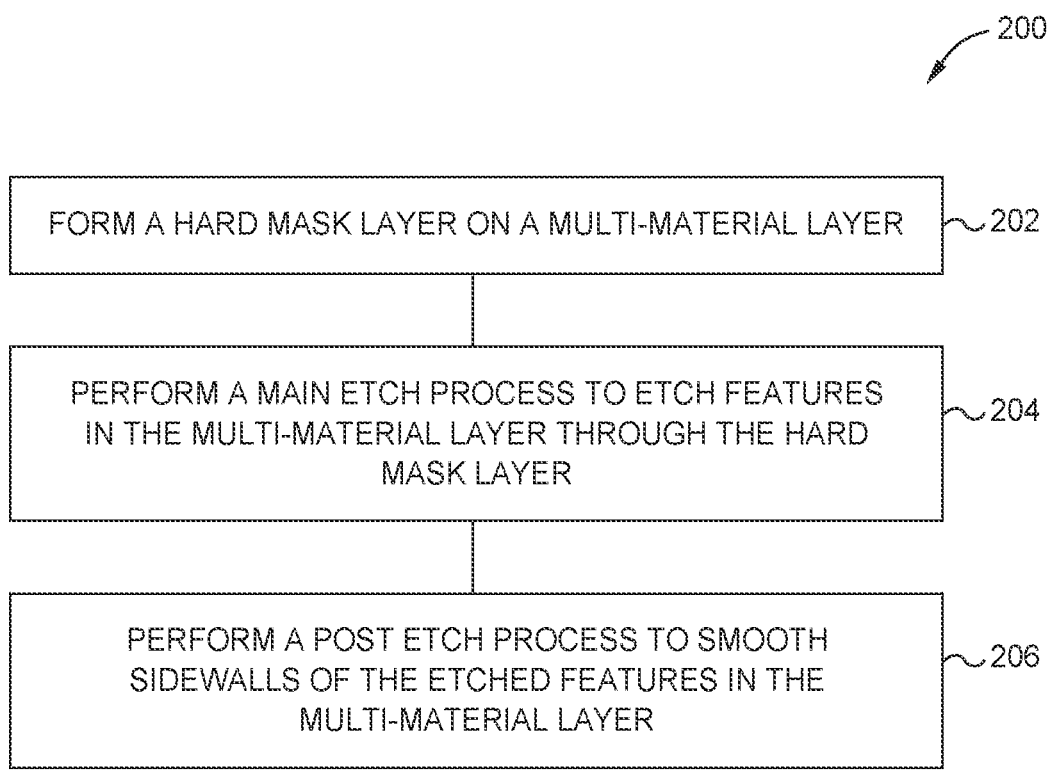
FIG. 2 is a flowchart of a method for patterning a material layer on a substrate, according to one or more embodiments of the present disclosure.

FIG. 2 is a flow diagram of a method 200 for patterning a material layer disposed on a substrate. FIGS. 3A-3D are cross-sectional views of a portion of a structure 300 formed on a substrate 302 corresponding to various stages of the method 200. The method 200 may be utilized to etch high aspect ratio features, e.g., greater than 10:1 in a material layer. Although the method 200 is described below with reference to etching a conductive material layer having a stair-like structures, the method 200 may also be used for manufacturing other types of structures.

The substrate 302 may be a silicon based material or any suitable insulating materials or conductive materials as needed. The substrate 302 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The substrate 302 may have various dimensions, such as 200 mm, 300 mm, 450 mm or other diameter wafers, as well as, rectangular or square panels. Unless otherwise noted, implementations and examples described herein are conducted on substrates with a 200 mm diameter, a 300 mm diameter, or a 450 mm diameter substrate. In the implementation wherein a SOI structure is utilized for the substrate 302, the substrate 302 may include a buried dielectric layer disposed on a silicon crystalline substrate. In the example depicted herein, the substrate 302 is a crystalline silicon substrate.

Figure 3A:
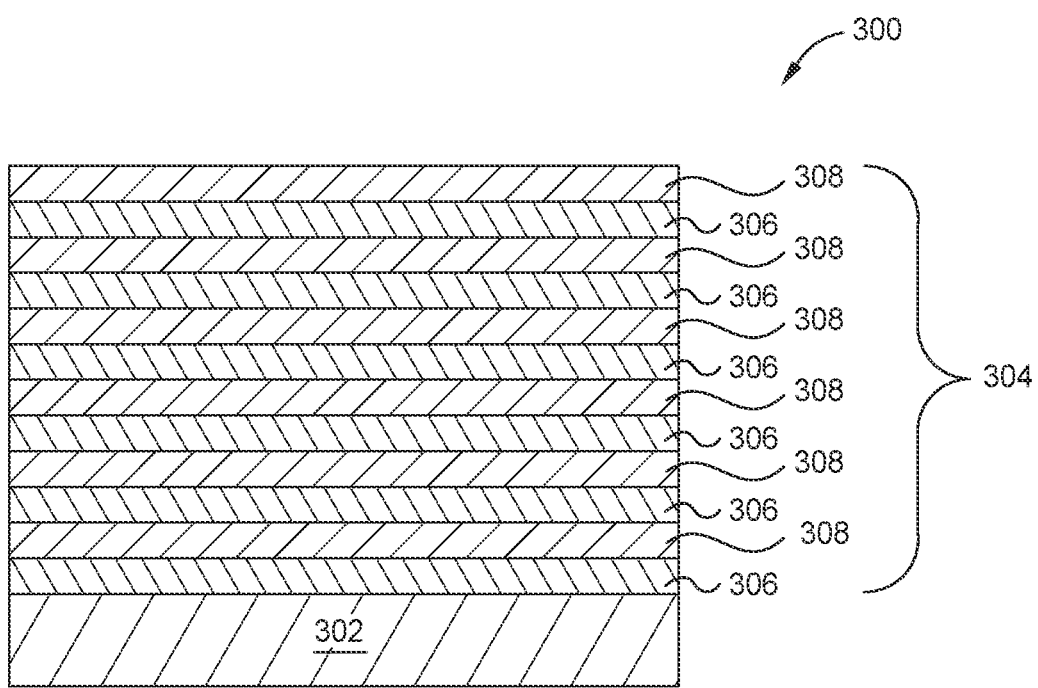
FIGS. 3A-3D illustrate cross sectional views of a structure during the patterning process of FIG. 2.

The structure 300 may include a multi-material layer 304 formed of conductive material and utilized to be part of an integrated circuit, such as gate electrodes, interconnect lines, and contact plugs. In some embodiments, the multi-material layer 304 includes a number of stacked layers formed on the substrate 302 as shown in FIG. 3A. The multi-material layer 304 may include first layers 306 and second layers 308 alternately formed over the substrate 302. Although FIG. 3A shows six repeating layers of first layers 306 and second layers 308 alternately formed on the substrate 302, any desired number of repeating pairs of first layers 306 and second layers 308 may be utilized as needed.

In some examples, the multi-material layer 304 may be formed of refractory metals, such as tungsten (W), molybdenum (Mo), tantalum (Ta), titanium (Ti), hafnium (Hf), vanadium (V), chromium (Cr), manganese (Mn), ruthenium (Ru), alloys thereof, silicide compounds thereof, nitride compounds thereof, or combinations thereof. In other examples, the first layers 306 and the second layers 308 may be other metals, such as copper (Cu), nickel (Ni), cobalt (Co), iron (Fe), aluminum (Al), palladium (Pd), gold (Au), silver (Ag), platinum (Pt), alloys thereof, nitride compound thereof, or combinations thereof. In one embodiment, the first layers 306 are formed of molybdenum (Mo) and the second layers 308 are formed of tungsten (W). The multi-material layer 304 may have a total thickness of between about 200 nm and about 4500 nm. The first layers 306 may each have a thickness of between about 10 nm and about 30 nm. The second layers 308 may each have a thickness of between about 10 nm and about 30 nm.

Figure 3B:
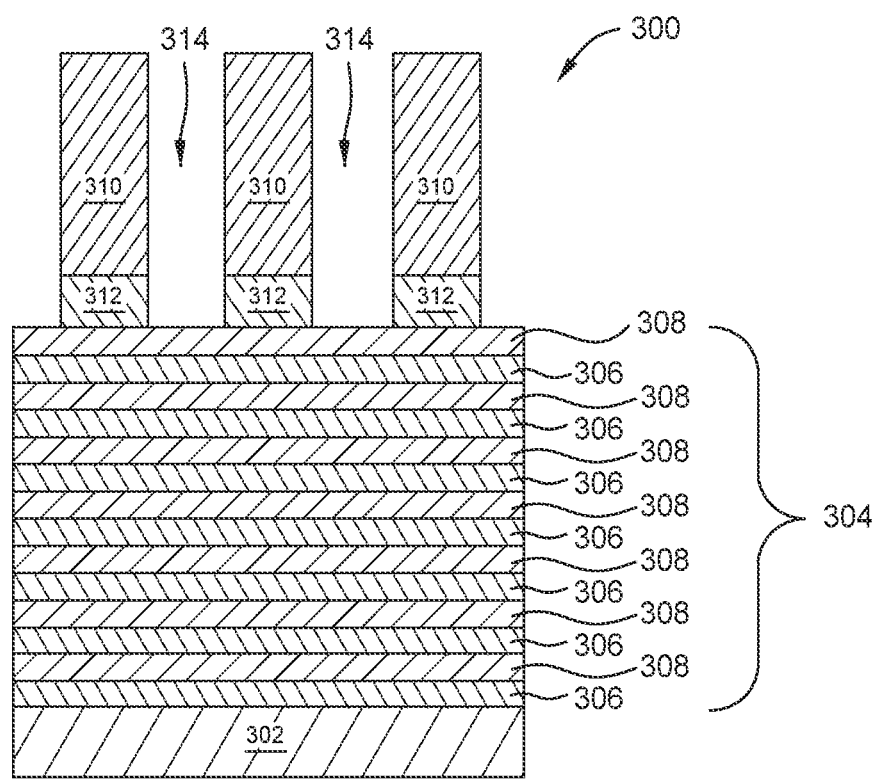
Figure 3C:
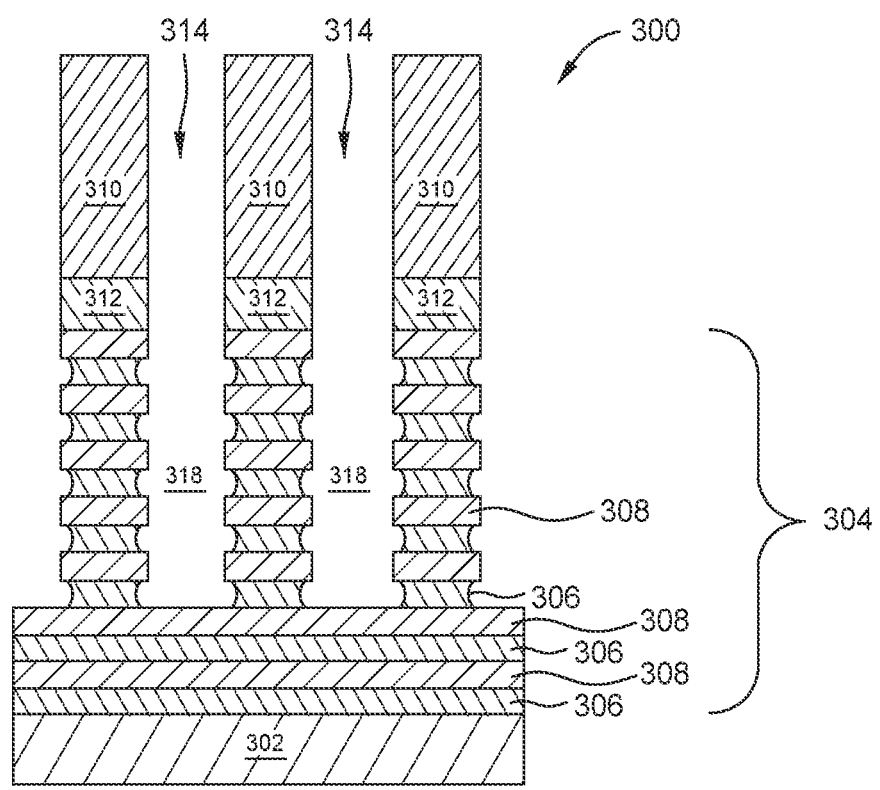
Figure 3D:
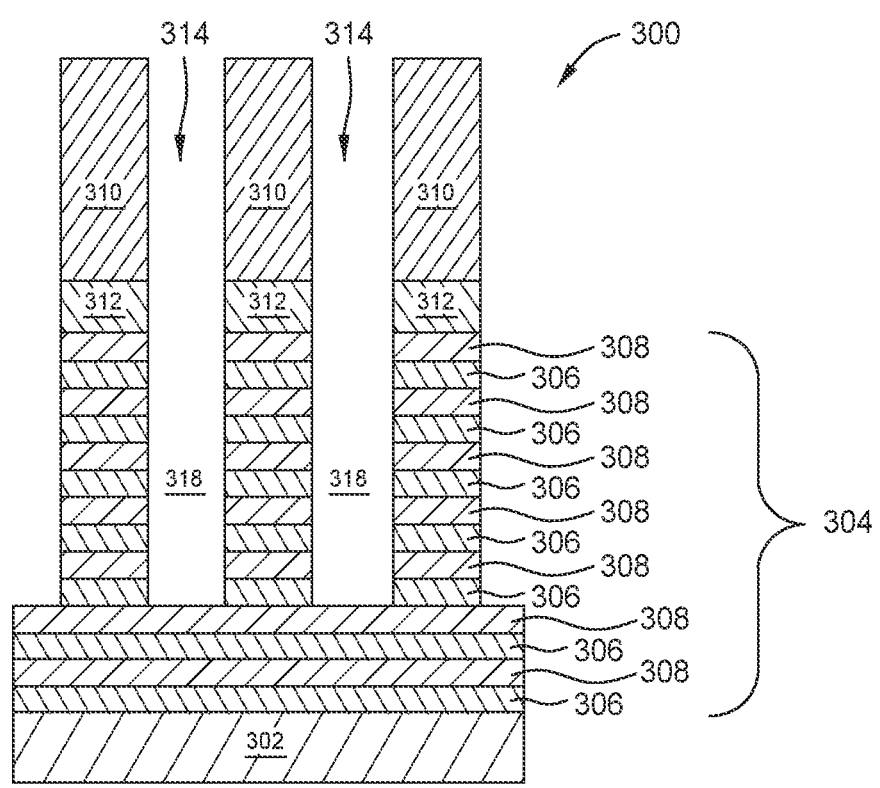

The method 200 begins at block 202 by, prior to an etching process, forming an etch resist hard mask (referred to as a "hard mask" hereinafter) 310 on the multi-material layer 304 in a processing chamber. As shown in FIG. 3B, the structure 300 includes the hard mask layer 310 formed in a desired pattern on the multi-material layer 304. The pattern on the hard mask layer 310 may have openings 314 having a dimension of between about 1000 nm and about 1300 nm, to form features having a high aspect ratio (e.g., greater than about 5:1), and a pitch between adjacent openings 314 of between about 50 nm and about 180 nm. The structure 300 includes an adhesion layer 312 formed between the multi-material layer 304 and the hard mask layer 310. The adhesion layer 312 may function as a barrier layer between the multi-material layer 304 and the hard mask layer 310. The adhesion layer 312 may also function as a polish stop for a subsequent chemical mechanical polishing (CMP) step.

The hard mask layer 310 may be formed of tetra-ethyl-orthosilicate (TEOS) or silicon oxynitride (SiON) and have a thickness 316 of about 500 nm and about 2 µm. The adhesion layer 312 may be formed of any dielectric material, such as silicon nitride ($Si_3N_4$) and have a thickness of less than about 100 nm. The hard mask layer 310 and the adhesion layer 312 may be deposited by any conventional deposition process, such as a chemical vapor deposition (CVD) process, a physical vapor deposition (PVD) process, an atomic layer deposition (ALD) process, and a spin-on process, and subsequently patterned by a conventional photolithographic process using a patterned photoresist layer (not shown) covering the hard mask layer 310.

At block 204, a first etching process (also referred to as a "main etch" process) is performed to form features 318 (e.g., trenches or vias) in the multi-material layer 304 through the hard mask layer 310 using plasma excited species or radicals in a plasma process chamber, such as the plasma processing chamber 100 depicted in FIG. 1. In the main etch process at block 204, the multi-material layer 304 is etched using chlorine containing etching gas to a predetermined depth as chlorine containing etching gas provides a fast etch rate for the multi-material layer 304. The main etch process may be continued until a depth of the features 318 in the multi-material layer 304 reaches a predetermined depth. In some embodiments, the determined depth of the features 318 in the multi-material layer 304 is between about 200 nm and about 4500 nm.

Suitable examples of the chlorine containing etching gas include $Cl_2$, $SiCl_4$, $BCl_3$, $SiHCl_3$, $SiH_2Cl_2$, $SiH_3Cl$, and $Si_2Cl_6$. In one particular example, the chlorine containing etching gas includes $SiCl_4$, $Cl_2$, and $BCl_3$.

In some embodiments, the main etch process is performed by simultaneously supplying the chlorine containing etching gas and inert gas such as argon (Ar).

During the main etch process at block 204, several process parameters may also be regulated. In one example, $Cl_2$, $SiCl_4$, and $BCl_3$ gases may be supplied at flow rates of between about 100 sccm and about 1000 sccm, for example, about 490 sccm, between about 10 sccm and about 140 sccm, for example, about 30 sccm, and between about 100 sccm and about 500 sccm, for example, about 300 sccm, respectively. Inert gas such as argon (Ar) may be supplied at a flow rate of less than about 900 sccm, for example, about 400 sccm. In one exemplary embodiment, a process pressure in the plasma processing chamber 100 is regulated between about 10 mTorr and about 50 mTorr, for example, about 20 mTorr.

An RF source and/or bias power may be utilized while performing the main etch process at block 204. The RF bias power applied when supplying the etching gas assists in forming the reactive etchants with desired directionality so as to travel down to surfaces of the multi-material layer 304 that is exposed from the hard mask layer 310 to predominately etch the multi-material layer 304. In contrast, the elimination of the RF bias power can assist the reactive species in the plasma to be more uniformly distributed across the hard mask layer 310. For example, an RF source power of between about 500 Watts and about 2000 Watts may be applied to maintain a plasma inside the processing chamber 100. An RF bias power of between about 500 Watts and about 6000 Watts may be applied.

A substrate support pedestal to support the substrate 302, such as the substrate support pedestal 144 disposed in the plasma processing chamber 100, is maintained at a temperature of between about 50° C. and about 290° C., for example about 110° C. during the main etch process at block 204.

In the main etch process at block 204, due to a difference between an etch rate of the first layers 306 and an etch rate of the second layer 308, the etched features 318 (e.g. trenches or vias) in the multi-material layer 304 may have rough sidewalls having concaves in scallop-like shapes (referred to as "scallops") or other rough features. In the example shown in FIG. 3C, the first layers 306 formed of, for example, molybdenum (Mo), have a faster etch rate than the second layers 308 formed of, for example, tungsten (W) during the main etch process at block 204 using chlorine containing etching gas mixture. As a result, the first layers 306 are recessed (referred to as "scalloped") as compared to the second layer 308.

At block 206, a second etching process (also referred to as a "post etch" process) is performed to smooth the rough sidewalls of the features 318 etched in the main etch process at block 204. In the example shown in FIGS. 3C and 3D, the sidewalls of the features 318 formed in the multi-material layers 304 are etched in the post etch process at block 206. The second layers 308 formed of, for example, tungsten (W) have a faster etch rate than the first layers 306 formed of, for example, molybdenum (Mo) during the post etch process at block 206 using fluorine containing etching gas. As a result, the protrusions formed of tungsten (W) on the sidewalls of the features 318 are removed or reduced to scallops having a depth of less than about 1.5 nm and then the sidewalls of the features 318 are smoothed. Suitable examples of the fluorine containing etching gas include $SF_6$, $CH_2F_4$, $C_4F_8$, $CF_4$, $CHF_3$, $C_2F_6$, $C_3F_8$, or $NF_3$, HF.

In some embodiments, the post etch process is performed by simultaneously supplying the fluorine containing etching gas, passivation gas, and inert gas such as argon (Ar) in the plasma processing chamber.

The passivation gas selectively passivates the sidewalls of the features 318 to reduce bowing profiles of the sidewalls of the features 318. Suitable examples of the passivation gas include HBr, $BCl_3$, $SF_6$, or $H_2S$. In one particular example, the fluorine containing etching gas includes $SF_6$, and the passivation gas includes HBr.

The inert gas such as argon (Ar) at a high flow rate to generate low pressure at or near the bottom of the features 318 in the multi-material layer 304 such that the second etching gas reaches the bottom of the features 318 in the multi-material layer 304. Thus, the sidewalls of the features 318 can be smoothed.

During the post etch process at block 206, several process parameters may also be regulated. In one example, $SF_6$ and HBr gases may be supplied at flow rates of between about 25 sccm and about 150 sccm, for example, about 50 sccm, and between about 10 sccm and about 1000 sccm, for example, about 50 sccm, respectively. Inert gas such as argon (Ar) may be supplied at a flow rate of between 100 sccm and about 1000 sccm, for example, about 900 sccm. The fluorine containing etching gas is supplied pulsed at a pulse duration of between about 1 seconds and about 10 seconds, for example, about 5 seconds. A duty cycle (i.e., a ratio of an "on" period in which the fluorine containing etching gas is supplied to an "off" period in which the fluorine containing etching gas is not supplied) may be between about 1:3 and about 3:1, for example, about 1:1.

The post-etch process at block 206 may be repeated for between about 6 seconds and about 1800 seconds, for example, about 40 seconds, corresponding to about 4 pulse cycles-depending on the total thickness of the multi-material layer 304. In one exemplary embodiment, a process pressure in the plasma processing chamber 100 is regulated between about 10 mTorr and about 5000 mTorr, such as between about 20 mTorr and about 500 mTorr.

An RF source and/or bias power may be utilized while performing the etching process. For example, a RF source power of less than about 2000 Watts may be applied to maintain a plasma inside the processing chamber 100. An RF bias power of less than about 6000 Watts may be applied when the fluorine containing etching gas is supplied, and an RF bias power of between about 1000 Watts and about 6000 Watts may be applied.

The plasma processing chamber is maintained at a temperature of between about 75° C. and about 110° C., for example about 110° C. at the post etch process at block 206.

In some embodiments, a flow rate of the $SF_6$, the number of $SF_6$ pulse periods, and the temperature in the plasma processing chamber are adjusted to modulate smoothness of the sidewalls (e.g., a depth of scallops) of the features 318.

Benefits of the present disclosure include improvement in patterning features with accurate and uniform profiles for three dimensional (3D) stacking of semiconductor chips. The methods according to the embodiments disclosed herein utilize a two-step etching process, which includes a main etch process to form features through a stacked metal layer by continuously supplying chlorine containing etching gas, and a post etch process to smooth sidewalls of the features through the stacked metal layer by pulsing fluorine containing etching gas. The main etch process provides a fast etch rate through the stacked metal layer while the post etch process is adjusted to smooth the sidewalls of the features at a desired smoothness. By doing so, features having smooth sidewalls can be formed at a high overall etch rate.

While the foregoing is directed to embodiments of the present disclosure, other and further embodiments of the disclosure may be devised without departing from the basic scope thereof, and the scope thereof is determined by the claims that follow.

We claim:

1. A method for patterning a material layer on a substrate, comprising:
   forming a hard mask layer on a material layer disposed on a substrate, the material layer comprising a plurality of first layers and a plurality of second layers alternately formed over the substrate;
   performing a first etch process to form features in the material layer through the hard mask layer by supplying a first etching gas; and
   performing a second etch process to smooth sidewalls of the features formed in the material layer by suppling a second etching gas, wherein
   the first etching gas is supplied continuously and the second etching gas is pulsed.

2. The method of claim 1, wherein the plurality of first layers comprises molybdenum (Mo) and the plurality of second layers comprises tungsten (W).

3. The method of claim 1, wherein
   the material layer has a thickness of between 200 nm and 4500 nm, and
   the plurality of first layers and the plurality of second layers each have a thickness of between 10 nm and 30 nm.

4. The method of claim 1, wherein during the second etch process, passivation gas and Ar gas are also supplied.

5. The method of claim 4, wherein
the first etching gas comprises $Cl_2$, and
the second etching gas comprises $SF_6$.

6. The method of claim 4, wherein
the passivation gas comprises HBr.

7. The method of claim 6, wherein during the second etch process, the second etching gas is pulsed at a pulse duration of between 1 second and 10 seconds and a duty cycle of between 1:3 and 3:1.

8. The method of claim 1, wherein the hard mask layer comprises tetra-ethyl-orthosilicate (TEOS).

9. A method for etching a material layer on a substrate through a hard mask in a processing chamber, comprising:
supplying a first etching gas to a material layer having a hard mask formed thereon in a processing chamber, the material layer comprising a plurality of first layers and a plurality of second layers alternately formed over a substrate; and
subsequent to supplying the first etching gas, supplying a second etching gas into features etched in the material layer by the first etching gas, wherein
the first etching gas is supplied continuously and the second etching gas is pulsed.

10. The method of claim 9, wherein the plurality of first layers comprises molybdenum (Mo) and the plurality of second layers comprises tungsten (W).

11. The method of claim 9, wherein
the material layer has a thickness of between 200 nm and 4500 nm, and
the plurality of first layers and the plurality of second layers each have a thickness of between 10 nm and 30 nm.

12. The method of claim 9, wherein while the second etching gas is supplied, passivation gas and Ar gas are also supplied.

13. The method of claim 12, wherein
the first etching gas comprises $Cl_2$, and
the second etching gas comprises $SF_6$.

14. The method of claim 12, wherein
the passivation gas comprises HBr.

15. The method of claim 14, wherein the second etching gas is pulsed at a pulse duration of between 1 second and 10 seconds and a duty cycle of between 1:3 and 3:1.

16. A method for smoothing sidewalls of features etched in a material layer, comprising:
pulsing fluorine containing etching gas to a material layer in a processing chamber, the material layer comprising a plurality of first layers and a plurality of second layers alternately formed over a substrate; and
continuously supplying passivation gas and Ar gas in the processing chamber.

17. The method of claim 16, wherein the plurality of first layers comprises molybdenum (Mo) and the plurality of second layers comprise tungsten (W).

18. The method of claim 16, wherein
the fluorine containing etching gas comprises $SF_6$, and
the passivation gas comprises HBr.

19. The method of claim 16, wherein the fluorine containing etching gas is pulsed at a pulse duration of between 1 second and 10 seconds and a duty cycle of between 1:3 and 3:1.

* * * * *